United States Patent
Handy (10) Patent No.: US 10,027,317 B2
(45) Date of Patent: Jul. 17, 2018

(54) SYSTEMS, METHODS, AND DEVICES FOR BIPOLAR HIGH VOLTAGE DIRECT CURRENT ELECTRICAL POWER DISTRIBUTION

(71) Applicant: GE Aviation Systems Limited, Cheltenham, Gloucestershire (GB)

(72) Inventor: Peter James Handy, Cheltenmah (GB)

(73) Assignee: GE Aviation Systems Limited, Cheltenham (GB)

( * ) Notice: Subject to any disclaimer, the term of this patent is extended or adjusted under 35 U.S.C. 154(b) by 129 days.

(21) Appl. No.: 15/240,526

(22) Filed: Aug. 18, 2016

(65) Prior Publication Data
US 2017/0054438 A1  Feb. 23, 2017

(30) Foreign Application Priority Data

Aug. 20, 2015 (GB) .................................. 1514878.6

(51) Int. Cl.
 H02J 3/36 (2006.01)
 H03K 17/082 (2006.01)
 H03K 17/18 (2006.01)
 H02H 3/087 (2006.01)

(52) U.S. Cl.
CPC ......... *H03K 17/0822* (2013.01); *H02H 3/087* (2013.01); *H02J 3/36* (2013.01); *H03K 17/18* (2013.01); *B64D 2221/00* (2013.01); *H03K 2217/0054* (2013.01)

(58) Field of Classification Search
CPC .............. H03K 17/0822; H03K 17/18; H03K 2217/0054; H02J 3/36; B64D 2221/00; H02H 3/087
See application file for complete search history.

(56) References Cited

U.S. PATENT DOCUMENTS

| | | |
|---|---|---|
| 4,800,331 A | 1/1989 | Vesce et al. |
| 8,836,338 B2 | 9/2014 | Tyler et al. |
| 2011/0292555 A1 | 12/2011 | Shipley |

(Continued)

FOREIGN PATENT DOCUMENTS

| | | |
|---|---|---|
| EP | 2 827 158 B1 | 12/2016 |
| GB | 2501693 B | 1/2016 |

(Continued)

OTHER PUBLICATIONS

Great Britain Combine Search Report and Examination Report issued in connection with corresponding GB Application No. 1514878.6 dated Feb. 9, 2016.

(Continued)

*Primary Examiner* — Robert Deberadinis
(74) *Attorney, Agent, or Firm* — GE Aviation Systems Limited; William Andes (57) ABSTRACT

Systems, methods and devices for aircraft power distribution include a bipolar high voltage direct current source component; an electrical loading component capable of drawing electrical power from the bipolar high voltage direct current source component; a set of switching components configured to selectively couple power from the bipolar high voltage DC source component to the electrical loading; and a transient suppression component. The transient suppression component is configured to limit current flowing through the first or the second subset of the set of switching components when the first and the second subsets are not in the same state.

20 Claims, 8 Drawing Sheets

(56) References Cited

U.S. PATENT DOCUMENTS

2012/0153963 A1    6/2012  Tyler
2014/0078622 A1    3/2014  Crane

FOREIGN PATENT DOCUMENTS

| GB | 2518592 B | 2/2016 |
|---|---|---|
| GB | 2529255 B | 1/2017 |
| GB | 2541026 A | 2/2017 |
| JP | 2004-254447 A | 9/2004 |
| JP | 2005-039877 A | 2/2005 |
| JP | 2007-174490 A | 7/2007 |
| JP | 2009-095225 A | 4/2009 |
| JP | 2014-131374 A | 7/2014 |
| JP | 2015-512238 A | 4/2015 |
| JP | 2016-537960 A | 12/2016 |
| JP | 2017-060381 A | 3/2017 |
| WO | 2013/161364 A1 | 10/2013 |
| WO | 2015/059408 A1 | 4/2015 |
| WO | 2015/075410 A1 | 5/2015 |
| WO | 2015/124884 A1 | 8/2015 |
| WO | 2016/163982 A1 | 10/2016 |
| WO | 2017/000981 A1 | 1/2017 |

OTHER PUBLICATIONS

Notification of Reasons for Refusal issued in connection with corresponding JP Application No. 2016-156067 dated Nov. 7, 2017.
Canadian Office Action issued in connection with corresponding CA Application No. 2939740 dated Mar. 6, 2018.

SYSTEMS, METHODS, AND DEVICES FOR BIPOLAR HIGH VOLTAGE DIRECT CURRENT ELECTRICAL POWER DISTRIBUTION

BACKGROUND

Electrical power distribution systems manage the allocation of power from energy sources to electrical loads that consume distributed electrical power. In aircraft, gas turbine engines for propulsion of the aircraft typically provide mechanical energy that ultimately powers a number of different accessories such as generators, starter/generators, permanent magnet generators (PMG), fuel pumps, and hydraulic pumps, e.g., equipment for functions needed on an aircraft other than propulsion. For example, contemporary aircraft need electrical power for electrical loads related to avionics, motors, and other electric equipment.

Over time, aircraft electrical power source voltages have increased. Aircraft with 14- and 28-volt direct current (VDC) electrical power systems have given way to aircraft with electrical power systems operating at 115 volts alternating current (VAC) and 230 VAC. Presently, aircraft can include one or more electrical power sources that operate at voltages including plus/minus 270 VDC. For example, a current wide-body twin-engine commercial jetliner uses an electrical system that is a hybrid voltage system that includes sub-systems operating at voltages of 230 VAC, 115 VAC, 28 VDC along with a bipolar, high voltage, direct current subsystem that includes plus and minus 270 VDC sources.

The voltages in the high-voltage DC electrical systems reach levels comparable to domestic AC systems and need to include fault mitigation features to detect and react to abnormal electrical current flow that can occur in the system. In domestic AC systems fault protection devices typically include a circuit breaker that can trip to an off position, typically by way of an electromechanical switch that can actuate in approximately 50 milliseconds (ms) to de-energize the feed line in the event of a fault condition. An electromechanical switch passing current from a high-voltage DC source to an electrical load draws an arc on opening the switch when the electron flow across the opening switch contacts ionizes the air molecules across the gap between the contacts to form a gas plasma. The plasma is of low resistance and is able to sustain power flow. The plasma is hot and capable of eroding the metal surfaces of the switch contacts. Electric current arcing causes degradation of the contacts and therefore the electromechanical switch and also electromagnetic interference (EMI) that can require the use of arc suppression methods.

BRIEF DESCRIPTION

In one aspect, a system for aircraft power distribution includes a bipolar high voltage direct current source component with a positive voltage lead and a negative voltage lead; an electrical loading component capable of drawing electrical power from the bipolar high voltage direct current source component; a set of switching components configured to selectively couple power from the bipolar high voltage DC source component to the electrical loading component by switching between an open state that decouples power from the bipolar high voltage direct current source component to the electrical loading component and a closed state that couples power from the bipolar high voltage direct current source component to the electrical loading component wherein a first subset of switching components are coupled to the positive lead of the bipolar high voltage direct current source component and a second subset of switching components are coupled to the negative lead of the bipolar high voltage direct current source component; and a transient suppression component. The transient suppression component is configured to limit current flowing through the first or the second subset of the set of switching components when the first and the second subsets are not in the same state.

In another aspect, a method of distributing power includes applying power from a bipolar high voltage direct current source component with a positive voltage lead and a negative voltage lead to an electrical loading component capable of drawing power from the bipolar high voltage direct current source component through a set of switching components configured to selectively couple power from the bipolar high voltage DC source component to the electrical loading component by switching between an open state that decouples power from the bipolar high voltage direct current source component to the electrical loading component and a closed state that couples power from the bipolar high voltage direct current source component to the electrical loading component wherein a first subset of switching components are coupled to the positive lead of the bipolar high voltage direct current source component and a second subset of switching components are coupled to the negative lead of the bipolar high voltage direct current source component and limiting the current flowing through the set of switching components when the first subset and the second subset are not in the same state with a transient suppression component.

In another aspect, a power switching device, includes a set of switching components configured to selectively couple power from a bipolar high voltage DC source component to an electrical loading component by switching between an open state that decouples power from the bipolar high voltage direct current source component to the electrical loading component and a closed state that couples power from the bipolar high voltage direct current source component to the electrical loading component wherein a first subset of switching components are coupled to the positive lead of the bipolar high voltage direct current source component and a second subset of switching components are coupled to the negative lead of the bipolar high voltage direct current source component and a transient suppression component coupled to the set of switching components. The transient suppression component is configured to limit current flowing through the first or the second subset of the set of switching components when the first and the second subsets are not in the same state.

DETAILED DESCRIPTION

The embodiments of the present disclosure are described herein in the context of an aircraft, which enables production of electrical power from an energy source such as a turbine engine, jet fuel, hydrogen, etc. However, it will be understood that while one embodiment is shown in an aircraft environment, the scope is not so limited and embodiments have general application to electrical power distribution systems in non-aircraft applications, such as other mobile applications and non-mobile industrial, commercial, and residential applications. For example, applicable mobile environments can include an aircraft, spacecraft, space-launch vehicle, satellite, locomotive, automobile, etc. Commercial environments can include manufacturing facilities or power generation and distribution facilities or infrastructure.

At least some of the embodiments provide for bipolar high-voltage electrical power distribution systems, methods and apparatuses that include transient detection and mitigation capabilities. The bipolar high-voltage electrical power distribution system includes a set of switching components such as solid-state power controllers (SSPC). It will be understood that "a set" can include any number of solid-state switches, including a single solid-state switch. Similarly, "a set" as used herein can include any number of elements, including a single element. It will be understood that a bipolar DC power supply or bipolar DC power source as used herein can be defined as a source of direct current electrical power where the output voltage can be set to positive or negative and can source current. It will be understood that high voltage DC as used herein can be defined as electrical energy at voltages high enough to damage solid-state components in the event of an electrical fault and can include but is not limited to voltages greater than provided by 28 VDC electric power sources integrated into many conventional aircraft.

Currently, few aircraft include bipolar high-voltage power sources such as plus and minus 270 VDC and none of these aircraft integrate an electrical power distribution system for bipolar high-voltage power. However, with the provision of a high-voltage DC electrical distribution system, bipolar high-voltage DC sources will no longer be confined to a single area of the aircraft. Consequently, bipolar high-voltage DC sources, by way of the electrical distribution system, will need the capability to suppress transient electrical activity and mitigate fault events that can occur anywhere on the aircraft where a load is powered by the bipolar high-voltage DC source.

Because of issues associated with electromechanical switches related to reliability and switching speed, solid-state switches are typically used in safety-critical power systems, such as those found in aircraft and including high voltage DC power applications. Solid-state switches are susceptible to damage resulting from a transient response in a circuit or electrical system. Electrical power systems such as provided on aircraft are exposed to a number of potential sources for transient electrical activity including, but not limited to equipment failure and lightning strikes. A transient protection scheme for high-voltage DC electrical distribution systems includes coordinating the timing of opening and closing the solid-state switches coupled to the positive and negative feeds a high-voltage DC source. The coordination of the solid-state switches includes a protective measure such that if a solid-state switch coupled to one of the positive and negative feeds fails, the other is not damaged.

Figure 1:
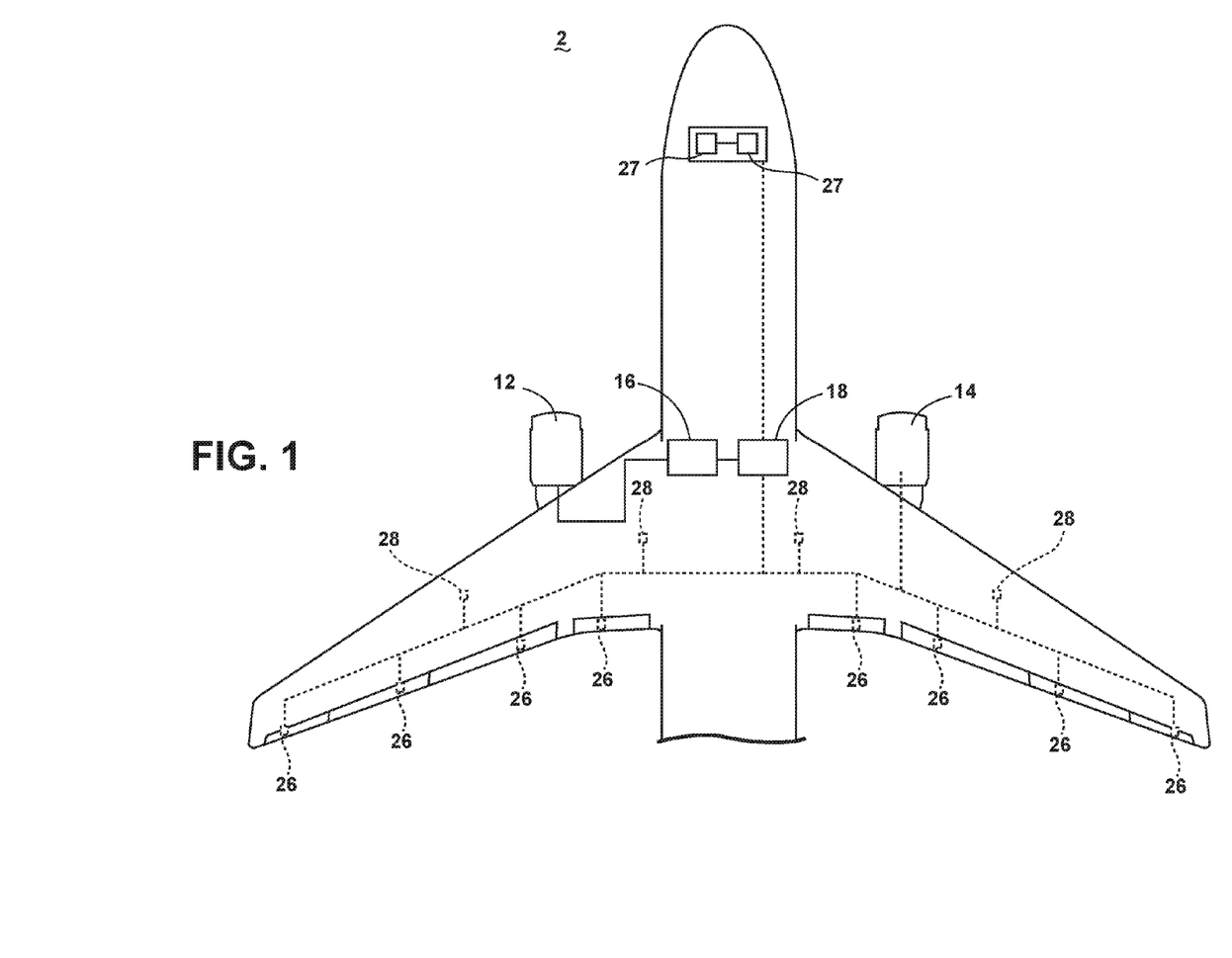
FIG. 1 is an example top down schematic illustration of an aircraft and electrical power distribution system in accordance with various aspects described herein.

Turning now to FIG. 1, an example top down schematic illustration of an aircraft and electrical power distribution system in accordance with various aspects described herein is shown. An aircraft 2 illustrated as having at least one gas turbine engine, shown here as a left engine system 12 and a right engine system 14 which can be substantially identical to each other. The aircraft 2 can have any number of engine systems. The left engine system 12 can be coupled to one or more electrical power sources 16 that convert mechanical energy into electrical power. It will be understood that any or all of the engines in an aircraft 2, including the left and right engine systems 12, 14 can be so coupled to one or more bipolar high-voltage DC electrical power sources 16. The bipolar high-voltage DC power source 16 can be coupled to an electrical power distribution system 18 that selectively energizes a set of systems and devices on the aircraft 2 that collectively make up the electrical load. Systems and devices powered by the bipolar high-voltage DC power source 16 by way of the electrical power distribution system 18 can be any system or device on an aircraft capable of drawing an electrical load and include, but are not limited to, flight control actuators 26, localized down-convertors 27 for cockpit displays, environmental control systems 28, etc.

In the aircraft 2, the operating left and right engine systems 12, 14 provide mechanical energy that can be extracted via a spool, to provide driving force for the bipolar high-voltage DC power source 16. Other power sources can include but are not limited to generators, batteries, fuel cells, backup power sources such as a Ram Air Turbine (RAT), rectifiers for converting one or more AC source inputs to a bipolar high-voltage DC source etc. The electrical power source 16, in turn, provides the generated power to the electrical loads for the systems and devices 26, 27, 28 for load operations which is distributed by the electrical power distribution system 18.

Figure 2:
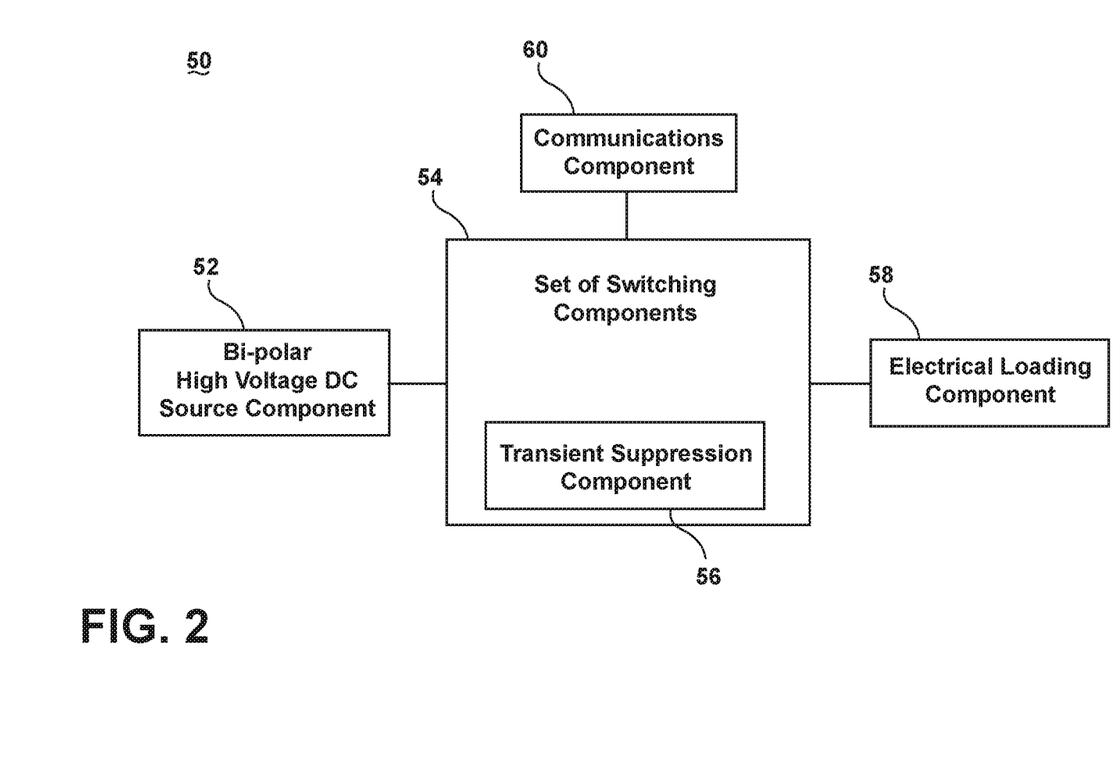
FIG. 2 is an example diagram of a high voltage DC electrical power distribution system in accordance with various aspects described herein.

Turning now to FIG. 2, an example diagram of a bipolar high-voltage DC electrical power distribution system 50 in accordance with various aspects described herein is shown. The bipolar high-voltage DC electrical power distribution system includes a bipolar high voltage DC source component 52 coupled to a set of switching components 54. The set of switching components 54 selectively couples power from the bipolar high voltage DC source component 52 to an electrical loading component 58. The set of switching components 54 includes a transient suppression component 56 to limit current flowing through the set of solid-state switching components during a transient voltage event. A communications component 60 is coupled to the set of switching components 54 to control and monitor the state of the set of switching components 54.

The bipolar high voltage DC source component 52 is a bipolar high-voltage DC power source or supply. The bipolar high voltage DC source component 52 can output any positive and negative voltage level for use in distributing electrical power to an electrical loading component 58 including but not limited to positive and negative 270 V.

The set of switching components 54 includes a set of solid-state switches. The set of solid-state switches can include any type of solid-state switch capable of switching on or off (i.e. closed or open) when an external voltage is applied across a set of control terminals of the switch. Each of the solid-state switches in the set of switching components 54 can include a solid-state electronic switching device which switches power to the load circuitry of the electrical loading component 58, and a coupling mechanism to enable the control signal to activate the switch without electromechanical components. The set of switching components 54 can be any type of solid-state electronic switches including but not limited to a solid-state power controller (SSPC), a solid-state relay including a single metal-oxide-semiconductor field-effect transistor (MOSFET), a solid-state relay including multiple MOSFETs arranged in a parallel configuration, etc. The semiconductor switching elements of the set of switching components can be formed of any material used for solid-state switching electronic applications including but not limited to silicon, silicon carbide, gallium nitride, etc.

One configuration of the set of switching components 54 includes the provision of SSPCs which are semiconductor devices that control electrical power supplied to a load. Additionally, SSPCs perform supervisory and diagnostic functions in order to identify overload conditions and prevent short circuits. Functionally, SSPCs are similar to circuit breakers with electromechanical switching elements that will protect wiring and loads from faults. SSPCs can switch states within the order of microseconds in comparison to electromechanical switches that can require approximately 30 ms or more to complete a transition from one state to another. Implemented with SSPCs, the set of switching components 54 can include built-in monitoring and protection features including but not limited to voltage monitoring, current monitoring, temperature monitoring to ensure that the negative and positive SSPCs do not overheat, current limiting, $I^2t$ monitoring, arc fault protection, and low-fidelity ground fault protection, etc. The built-in monitoring and protection features of SSPCs enable the set of switching components 54 to function as a controller that can control outputs to loads to ensure proper operations. SSPCs can include configurable microprocessors that can be programmed to increase controlling characteristics. Each SSPC can include any configuration, topology or electronic components for use in switching power in the high voltage DC electrical power distribution system 50 including but not limited to the provision of each SSPC to include one or more semiconductor devices in parallel to boost current carrying capability, the configuration of SSPCs to be bidirectional by using two unidirectional devices in series, etc.

The set of switching components 54 can include any number of switches including but not limited to one switch coupled to a positive lead from the bipolar high voltage DC source component 52 and a second switch coupled to a negative lead from the bipolar high voltage DC source component 52. Therefore, in one configuration, the set of switching components 54 includes a first SSPC coupled to a positive lead from the bipolar high voltage DC source component 52 and a second SSPC coupled to a negative lead from the bipolar high voltage DC source component 52.

The communications component 60 controls and monitors the state of the set of switching components 54 in part by communicating with other control elements of the aircraft. For example, the communications component 60 reports the status of the SSPCs back to other vehicle management control systems. The communications component 60 can transmit data indicative of commands to the switch, read a status of the switch that includes whether the switch is open or closed, and monitor a health of the switch. For instance the status of the switch can include an indication of whether the switch is open or closed, and the health of the switch can include a temperature indication. The communications component 60 can be based on any data communications hardware and protocol capable of transmitting data related to the control and the state of the set of switching components 54 including but not limited to a balanced interconnecting cable configured to implement Recognized Standard 485 (RS-485), a two wire serial cable configured to implement controller area network (CAN bus) protocol, a three or five wire serial cable configured to implement Recognized Standard 232 (RS-232), etc.

The transient suppression component 56 limits the flow of current through the set of switching components 54 in the bipolar high voltage DC distribution system 50. With a bipolar high voltage electrical distribution system 50, current travels from the bipolar high voltage DC source component 52, out to the set of switching components 54, out to the electrical loading component 58 and then back again. Therefore, the transient suppression component 56 is configured to limit or arrest current flowing through the set of switching components 54 during an over-voltage condition that can potentially sink a damaging level of current in one or more of the set of switching components 54. The transient suppression component 56 can be formed from and configured with any device capable of limiting current through a solid-state switching element including but not limited to a metal-oxide varistor (MOV), a transient voltage suppressor (TVS), flywheel (i.e., flyback, suppression, clamp, etc.) diode and combinations thereof that include elements internal and external to the set of switching components 54.

Figure 3:
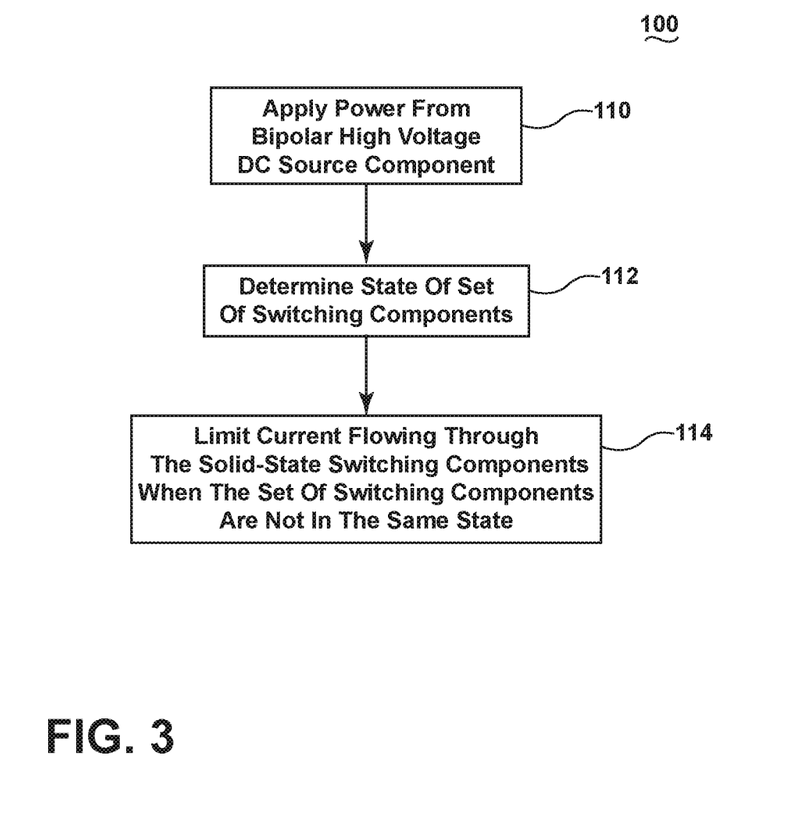
FIG. 3 is a flowchart illustrating a method of distributing power on a bipolar high voltage DC electrical power system in accordance with various aspects described herein.

Referring now to FIG. 3, a flowchart illustrating a method 100 of distributing power on a bipolar high voltage DC electrical power system 50 in accordance with various aspects described herein is shown. At 110, the bipolar high voltage DC source component 52 applies power to the bipolar high voltage DC distribution system 50. Depending on the type or configuration of the bipolar high voltage DC source component 52, the application of power can include activating a generator, starting an engine, issuing a control command to energize the source, closing one or more circuits, etc. During normal or idealized operations, the set of switching components 54 close and the electrical loading components 58 are energized and correctly sink power as per the operational requirements of the electrical loading components 58. In abnormal operations or even in actual, nominal real-world operations, the set of switching components 54 are not always in the same state. For example, one switch can be open when another is closed. In some instances, the asymmetry in the state of the set of switching components 54 occurs because of a fault in the bipolar high voltage DC power distribution system 50. In other instances, the asymmetry in the state of the set of the switching components 54 occurs because of a lack in simultaneity of the switching events. That is, one switch changes state before another switch in the set of switching components 54. The lack of simultaneity in the switching of the set of switching components 54 occurs, in part, because of the finite level of coordination that can be achieved with electronic control. Additionally or alternatively, the lack of simultaneity can be further exacerbated by operational requirements that can include, but are not limited to, physical separation of the switches. For instance, switches are often separated by at least one foot to enforce electrical isolation due to the high voltage of the bipolar high voltage DC electrical power system 50. The physical separation can cause minor unsynchronized switching to occur due to delays in communication between switches.

Therefore, at step 112, a determination of the state of the set of switching components 54 includes determining whether all of the switches are open or closed. If all of the switches in the set of switching components 54 are not in the same state, the transient suppression component 56 limits the current flowing through the set of solid-state switching components 54. At step 114, the transient suppression component 56 limits the current flowing through the set solid-state switching components 54 to provide a protective measure for the set of solid-state switching components 54.

Figure 4:
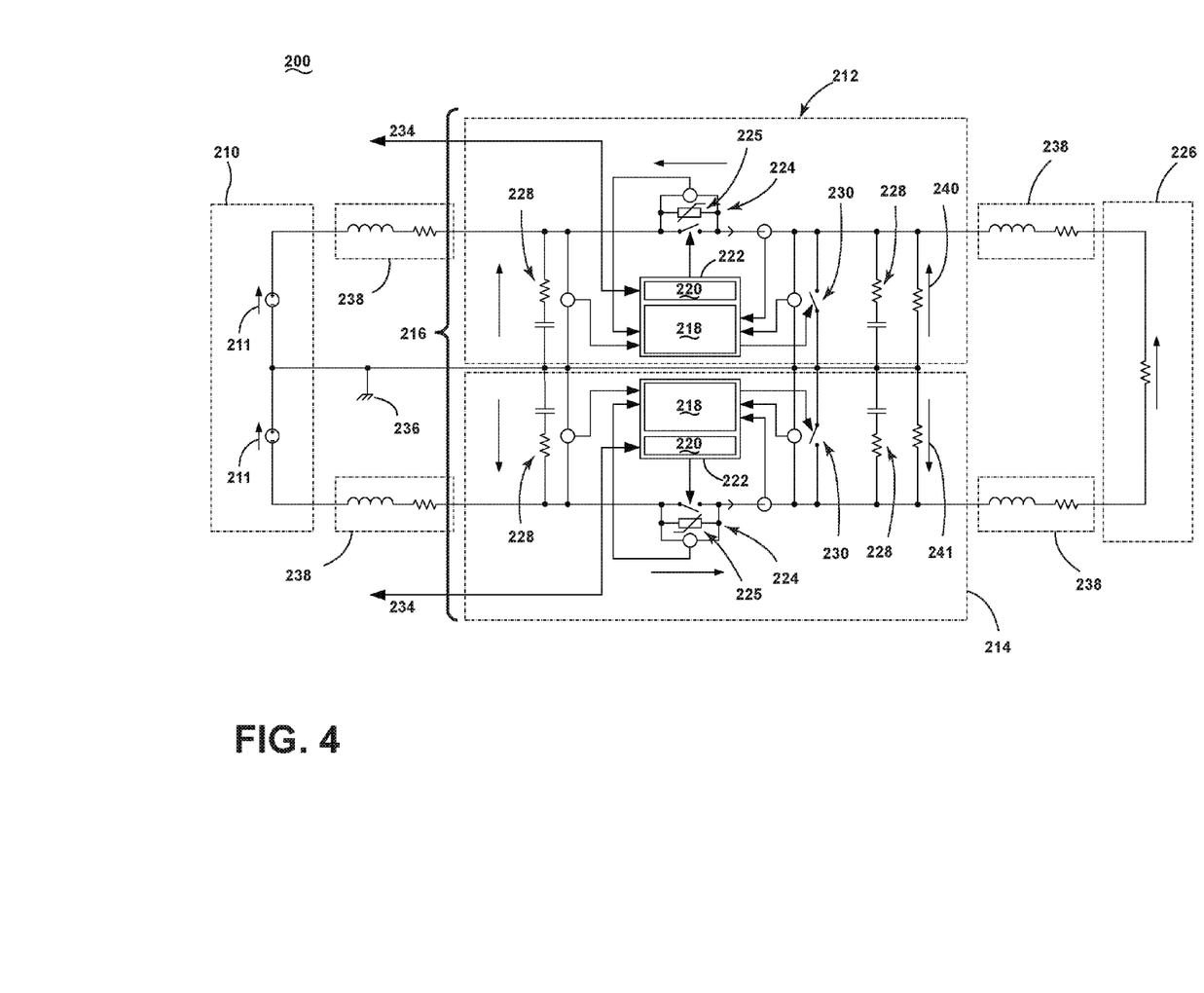
FIG. 4 is an example schematic illustration of a bipolar high voltage electrical power distribution system in accordance with various aspects described herein.

Referring now to FIG. 4, an example schematic illustration of a bipolar high voltage electrical power distribution system 200 in accordance with various aspects described herein is shown. The bipolar high voltage DC source component 210 includes two high voltage DC sources 211 each coupled to chassis ground 236, one by the negative lead and the other by the positive lead. The bipolar high voltage DC source component 210 is coupled to the set of switching components 216 which includes two SSPCs 212 and 214; a first SSPC 212 coupled to the positive side of the bipolar high voltage DC source component 210 and a second SSPC 214 coupled to the negative side of the bipolar high voltage DC source component 210. The coupling between the bipolar high voltage DC source component 210 and the set of switching components 216 can include current limiting wire 238. The set of switching components 216 are coupled to the electrical loading component 226. The coupling between the set of switching components 216 and the electrical loading component 226 can include current limiting wire 238.

The first and second SSPC 212, 214 can include a number of subcomponents and modules for controlling and protecting the set of switching components 216. An SSPC 212, 214 can include a main solid state switch 224 that opens or closes to couple or decouple the electrical loading component 226 to the bipolar high voltage DC source component 210. As shown in FIG. 4, the main solid state switch 224 can include the transient suppression component 225 which can be formed of one or more protective elements including but not limited to a metal-oxide varistor (MOV), a transient voltage suppressor (TVS), etc. The transient suppression component 225 reacts to sudden or momentary overvoltage conditions indicative of a transient event and limits current flow through the main switch 224. An SSPC 212, 214 can include one or more snubber circuits 228 across the input of the switch, the output of the switch or both, to suppress voltage spikes and dampen ringing caused by circuit inductance when a switch opens. An SSPC 212, 214 can include one or more built-in test circuits 230 to provide Built-In Testing (BIT) features. The built-in test circuit 230 allows for operation of an Initiated Built-In Test (IBIT) scheme that enables self-testing of the SSPC 212, 214 to verify proper functioning of the SSPC 212, 214. The built-in test circuit 230 can test any feature of the SSPC and includes but is not limited to an arc fault detection circuit for the detection of an arc fault. When both SSPCs are open the voltage developed at the output of each SSPC due to semiconductor leakage is managed by resistive element 240, 241 coupled to the output of the SSPC 212, 214 and chassis ground 236. The SSPC 212, 214 can include a switch control subcomponent 222 that can coordinate communications with external communication components 234, enable protective functions via a monitoring module 218 and control the state of the main switch 224 of the SSPC 212, 214. The monitoring module 218 can include any monitoring features for determining potential events that can damage the switch including but not limited to voltage monitoring, current monitoring, temperature monitoring, current limiting, $I^2t$ monitoring, arc fault protection, and low fidelity ground fault protection, etc. The SSPC 212, 214 can provide differential feed fault protection where the output current of the positive SSPC 212 and the negative SSPC 214 is compared in order to determine a gross ground fault. The monitoring module 218 can monitor the output current and voltage at the SSPCs 212, 214 to provide series and parallel arc fault detection. The SSPCs 212, 214 include closed loop current limiting where each SSPC 212, 214 uses local closed-loop current feedback to ensure that current is shared evenly between SSPCs 212, 214 during current limiting events. The monitoring module 218 can provide current limiting by any configuration or technique useful for current limiting solid-state devices including but not limited to linear current limiting and pulse-width modulation (PWM) techniques. The control module 220 can control the state of the main switch 224 based on inputs from either external communications components 234 or the monitoring module 218 or combinations thereof.

By implementing the above-defined monitoring and protective measures the bipolar high voltage electrical power distribution system 200 can implement a number of steps to control and coordinate the SSPCs 212, 214. For example, the bipolar high voltage electrical power distribution system 200 includes the capacity to continuously monitor the status of each main switch 224 when they are in the open and closed states. When each main switch 224 is in a closed state, the monitoring module 218 can implement the $I^2t$ wire protection where if the monitoring module 218 determines that current deviated from a predetermined threshold curve, a command from the control module can set both main switches 224 to the open state. The predetermined threshold can be any current versus time curve that determines the $I^2t$ trip including but not limited to aerospace and industry standards that provide sample curves. Similarly, if the monitoring module 218 determines that the switch current in either SSPC 212, 214 exceeds a predetermined threshold, the current can be limited and main switches 224 tripped to the open state. The predetermined threshold can be any current level depending on the number of switching semiconductors available to pass current through the SSPC including but not limited to a current levels ranging between 10 and 1000 amperes (A). If the monitoring module determines that the temperature for an SSPC 212, 214 exceeds a nominal level, the control module 220 can set both SSPCs 212, 214 to the open state or report back to an external control component via the communications component 234. The nominal level can be any temperature depending on the particular SSPC including but not limited to 100 degrees Celsius (° C.).

When using two current limiting SSPCs 212, 214 in series, as shown in FIG. 4, if the current limit levels for each SSPC 212, 214 are equal, the bipolar high voltage electrical power distribution system 200 can experience instability in the closed loop current control. Consequently, the set of switching components 216 can include staggered current limit levels for each SSPC 212, 214. For example, the positive SSPC 212 current limit can be set to 600% and the negative SSPC current limit 214 can be set to 500%. In this way, the staggered current limit levels ensure that during a shorted load scenario that the positive SSPC 212 limits current first. Voltages and currents are monitored for status and health monitoring purposes. The SSPC 212, 214 can include elements and methods for controlling semiconductor leakage including but not limited to a bleed resistor 240. When switching the state of an SSPC 212, 214, so-called "turn on" and "turn off" events, the SSPC 212, 214 can control the load voltage dV/dt within a specific band by providing closed loop feedback on dV/dt. The specific band can be any voltage change per unit time, including but not limited to 100 V/microsecond for each switch in a plus and minus 270 VDC system. During SSPC "turn on" and "turn off" events, the SSPC 212, 214 can ramp the current limit set point to control the rate of rise of load current dI/dt.

Figure 5:
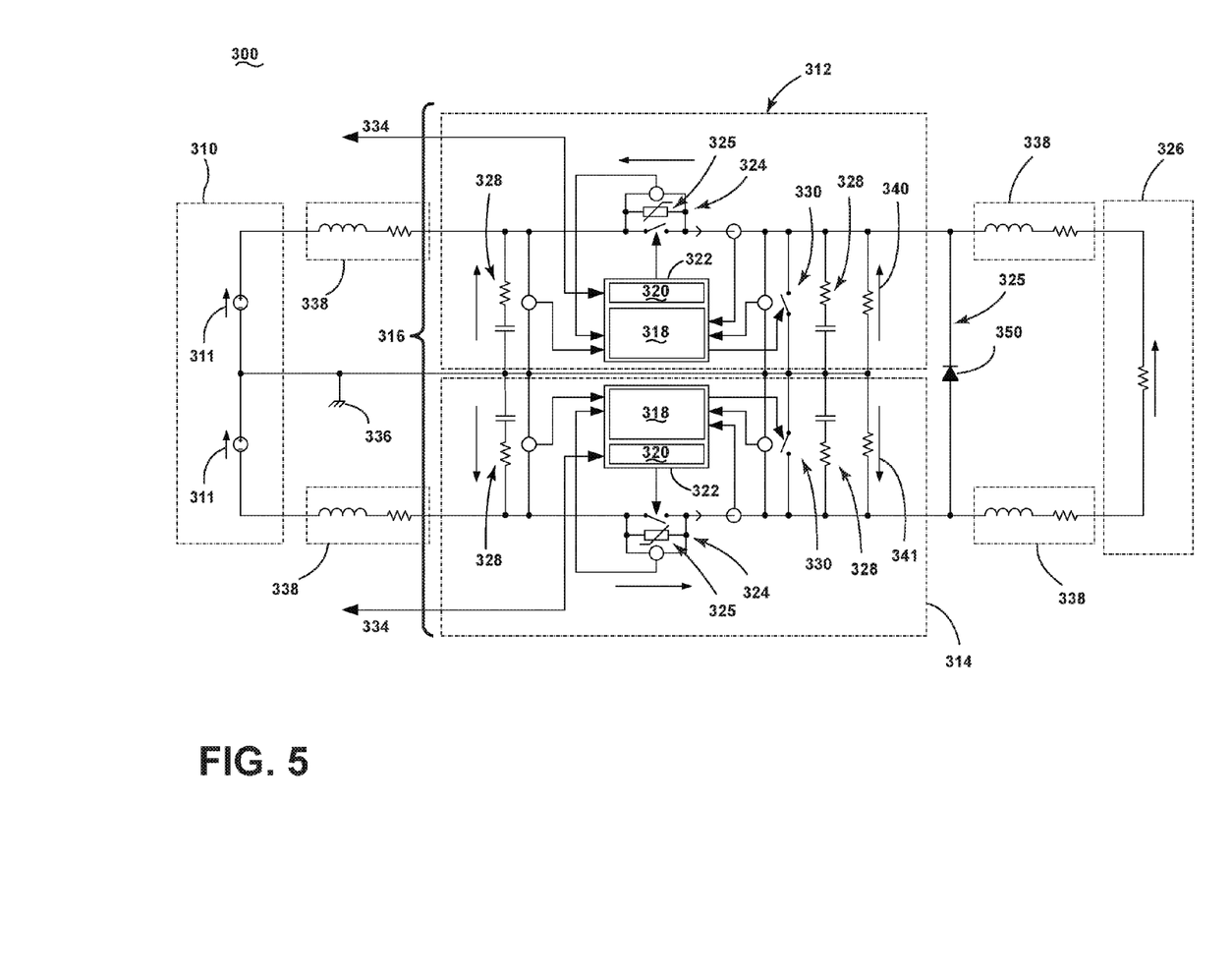
FIG. 5 is an example schematic illustration of a bipolar high voltage electrical power distribution system in accordance with various aspects described herein.
Figure 6:
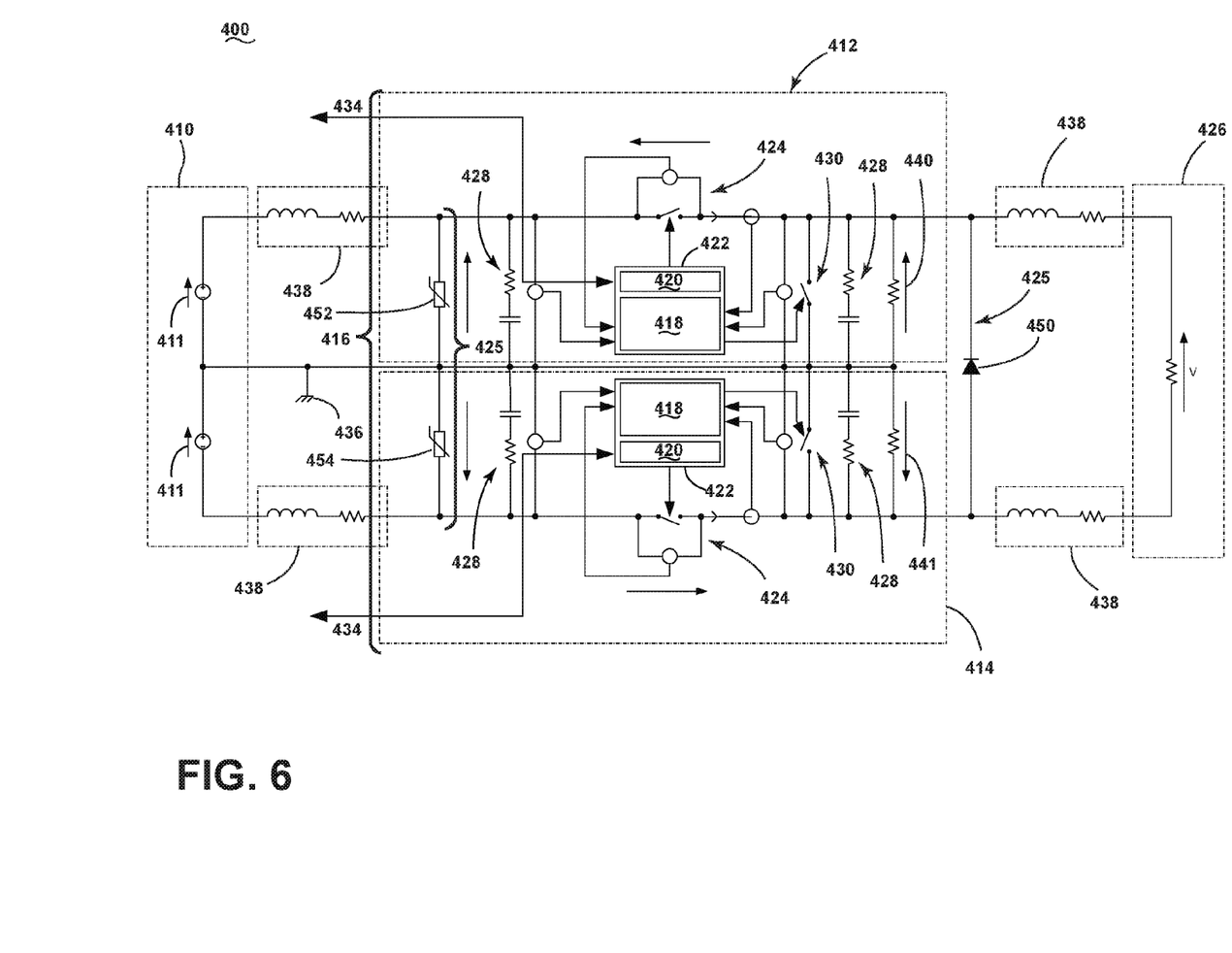
FIG. 6 is an example schematic illustration of a bipolar high voltage electrical power distribution system in accordance with various aspects described herein.

FIG. 5 is an example schematic illustration of a bipolar high voltage electrical power distribution system 300 in accordance with various aspects described herein. The bipolar high voltage electrical power distribution system is similar to that illustrated in FIG. 4; therefore, like parts will be identified with like numerals increased by 100, with it being understood that the description of the like parts of the first bipolar high voltage electrical power distribution system applies to the second bipolar high voltage electrical power distribution system, unless otherwise noted. FIG. 5 includes a transient suppression component 325 with an additional element shown as a flywheel diode 350 external to the set of switching components 316. The flywheel diode 350 can reduce the transient energy dissipated in the MOV or TVS devices across the main switch 324 of the SSPCs 312, 314. FIG. 6 is an example schematic illustration of a bipolar high voltage electrical power distribution system 400 in accordance with various aspects described herein. The transient suppression component 425 includes the flywheel diode 450 across the outputs of the set of switching components 416. The MOV or TVS devices 452, 454 are located across the inputs of the SSPCs 412, 414. Whereas in FIG. 5 and FIG. 6, the two SSPCs 212, 214, 312, 314 need to be co-located to reduce losses in the wiring of the flywheel diode 350,450, with the configuration in FIG. 4, the set of switching components 216 do not need to be co-located.

Figure 7:
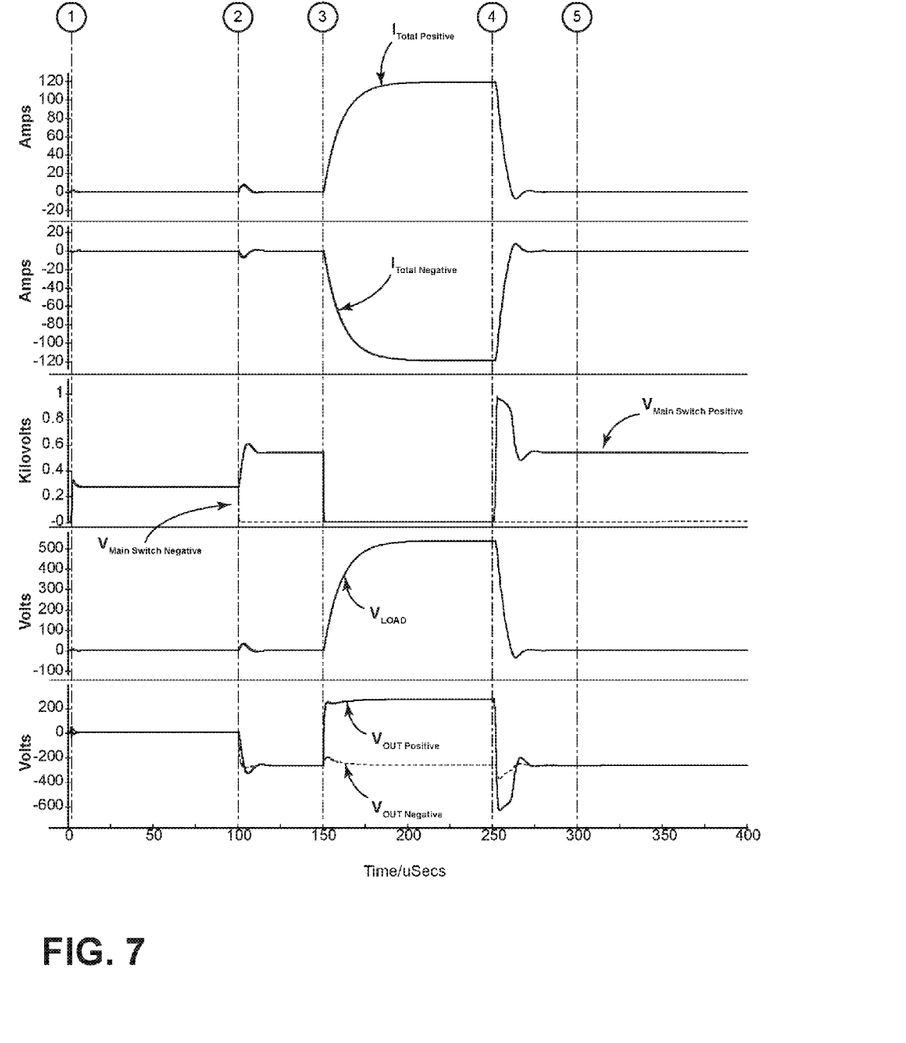
FIG. 7 is an example plot of voltage and current waveforms that demonstrates the operation of the bipolar high voltage electrical power distribution system in accordance with various aspects described herein.

FIG. 7 is an example plot of voltage and current waveforms that demonstrates the operation of the bipolar high voltage electrical power distribution system in accordance with various aspects described herein. The plot demonstrates how the above-described switch topology handles unsynchronized switching of the positive SSPC 212, 312, 412 and negative SSPC 214, 314, 414 such as occurs when the positive SSPC 212, 312, 412 and negative SSPC 214, 314, 414 are not co-located. At time (1), power is applied to the bipolar high voltage DC source component 52 which is a positive and negative 270 VDC supply such as shown in FIG. 4-6 as 210, 310, 410. The current through the set of SSPCs 216, 316, 416 increases momentarily as the capacitors of the input and output snubbers 228, 328, 428 charge. The voltage on each SSPC in the set of SSPCs 216, 316, 416 input rises to plus and minus 270 VDC and with the main switches 224, 324, 424 of the set of SSPCs 216, 316, 416 set to an open state, the voltage across both the positive and negative main switches 224, 324, 424 is 270 VDC.

At time (2), the main switch 224, 324, 424 of the negative SSPC 214, 314, 414 closes and the voltage across the main switch 224, 324, 424 of the negative SSPC 214, 314, 414 reduces to 0 V and the output voltage ("$V_{OUT\ Negative}$") from the negative SSPC 214, 314, 414 reduces to $-270$ V. Similarly, because the potential is present at the electrical loading component 226, 326, 426, the output voltage ("$V_{OUT\ Positive}$") of the positive SSPC 212, 312, 412 also reduces to $-270$ V. The voltage across the main switch of the positive SSPC 212, 312, 412 is 540 VDC. During this time, the load voltage remains at zero because the main switch 224, 324, 424 of the positive SSPC 212, 312, 412 has not been set to a closed state. The total current ("$I_{Total\ Positive}$" and "$I_{Total\ Negative}$") is small because of the charging of the positive and negative output snubbers 228, 328, 428.

At time (3), the main switch 224, 324, 424 of the positive SSPC 212, 312, 412 is set to the closed state and the voltage across the main switch 224, 324, 424 of the positive SSPC 212, 312, 412 reduces to 0 V and the output voltage of the positive SSPC 212, 312, 412 rises to positive 270 V. Similarly, the electrical loading component 226, 326, 426 is electrically coupled to the bipolar high voltage DC source component 210, 310, 410 and, therefore, the load voltage increases to 540 V and the total current rises to the 100% rated current (e.g. 120 A).

At time (4), the main switch 224, 324, 424 of the positive SSPC 212, 312, 412 is set to the open state and the voltage across the main switch 224, 324, 424 of the positive SSPC 212, 312, 412 increases to approximately 1 kV due to the MOV/TVS-clamped back electromotive force (EMF) caused by wiring loop inductance. The voltage across the main switch 224, 324, 424 of the positive SSPC 212, 312, 412 reduces to a steady state of 540 V. The load voltage also reduces to zero and the total SSPC output currents reduce to 0 A.

Figure 8:
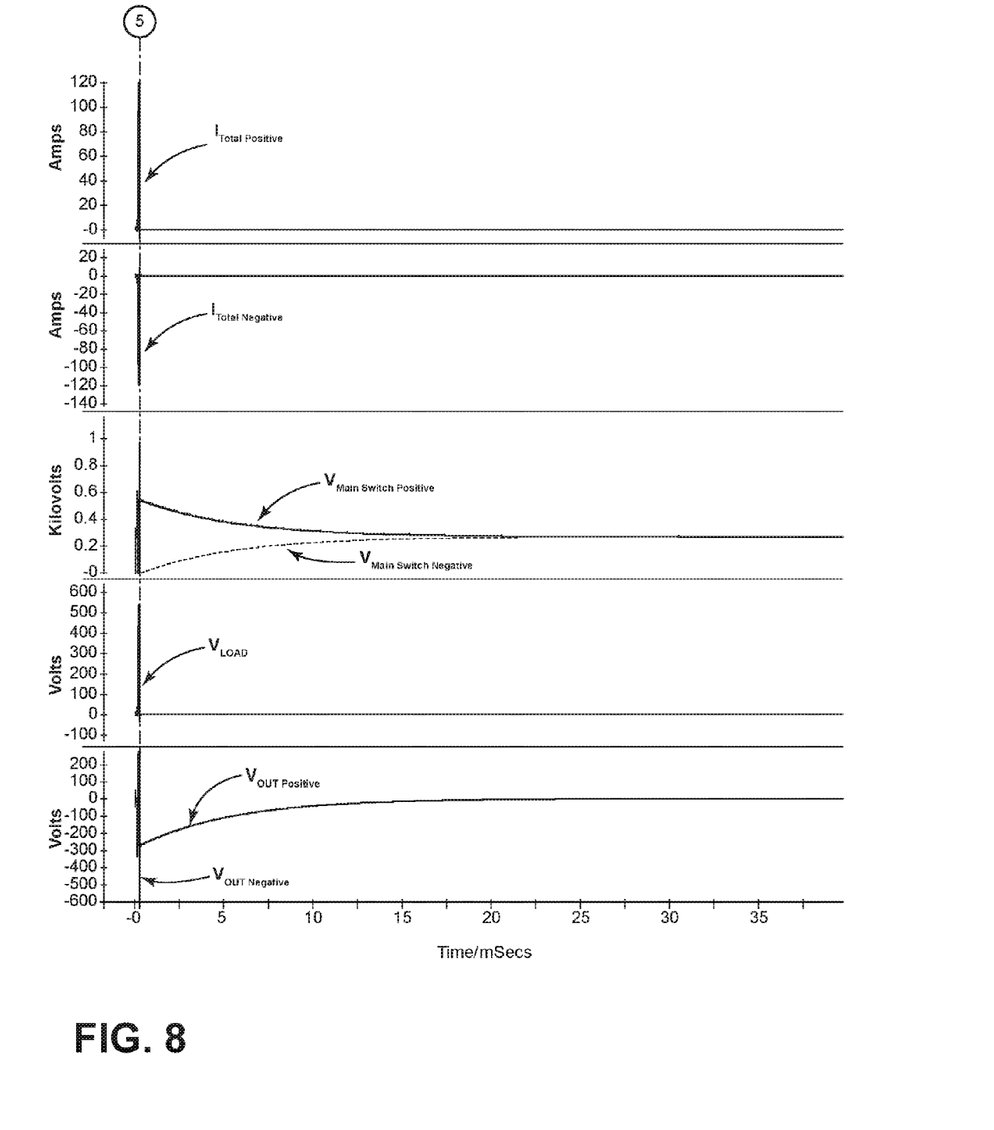
FIG. 8 is an example plot of voltage and current waveforms that demonstrates the operation of the bipolar high voltage electrical power distribution system in accordance with various aspects described herein.

The plots in FIG. 8 show when the main switch 224, 324, 424 of the negative SSPC 214, 314, 414 is set to the open state at time (5). Because the output snubbers 228, 328, 428, each hold significant energy and the leakage resistors 240, 241, 340, 341, 440, 441 include relatively high resistance values to reduce steady state losses, the capacitors of the snubbers 228, 328, 428 discharge in approximately 25 ms. Therefore the positive and negative output voltages and the positive and negative main switch voltages do not return to 0V, 0V, 270V and 270V respectively until 25 ms after the main switch 224, 324, 424 of the negative SSPC 214, 314, 414 is set to the open state.

Potentially beneficial effects of a high voltage DC bipolar power distribution in aircraft is that high levels of power can be delivered to a given load at lower current levels compared with those required in low voltage DC systems. In some cases the required current for a given load reduces given a constant power requirement and this therefore reduces the required wire gauge for a given load thus resulting in lighter wiring. Potentially beneficial effects of the above-described embodiments for solid state switching of high voltage DC bipolar power supplies include fast protection of and current limiting during short circuit events, fast protection against wire faults and arc faults, controlled charging of capacitive loads, and protection against inductive load switching and lightning. The configuration of the elements described above provide an electrical system topology that is tolerant of switch failure events including failure to open or close, tolerant of unsynchronized switching and provides secondary protection for each switch. Additionally, the topology can be implemented as unidirectional or bidirectional.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

This written description uses examples to disclose the embodiments, including the best mode, and also to enable any person skilled in the art to practice the embodiments, including making and using any devices or systems and performing any incorporated methods. The patentable scope of the application is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for aircraft power distribution, comprising:
a bipolar high voltage direct current source component with a positive voltage lead and a negative voltage lead;
an electrical loading component capable of drawing electrical power from the bipolar high voltage direct current source component;
a set of switching components configured to selectively couple power from the bipolar high voltage direct current source component to the electrical loading component by switching between an open state that decouples power from the bipolar high voltage direct current source component to the electrical loading component and a closed state that couples power from the bipolar high voltage direct current source component to the electrical loading component, wherein a first subset of the switching components are coupled to the positive lead of the bipolar high voltage direct current source component and a second subset of the switching components are coupled to the negative lead of the bipolar high voltage direct current source component; and
a transient suppression component coupled to the set of switching components and configured to limit current flowing through the first or the second subset of the set of switching components when the first and the second subsets are not in the same state.

2. The system of claim 1, wherein the first subset of the switching components includes a current limit level staggered from a current limit level of the second subset of the switching components such that when the electrical loading component experiences a short, the first subset of the switching components is configured to limit current before the second subset of the switching components.

3. The system of claim 1, wherein the bipolar high voltage direct current source component includes two 270 volt direct current power supplies.

4. The system of claim 3, wherein a negative lead of one of the two 270 volt direct current power supplies is coupled to a chassis ground and the positive lead of the other of the two 270 volt direct current power supplies is coupled to the chassis ground.

5. The system of claim 1, wherein the set of switching components includes two solid-state power controllers.

6. The system of claim 5, wherein the solid-state power controllers include a monitoring module that determines if the switch current in solid-state power controllers exceeds a predetermined threshold and a control module that can set the state of both of the solid-state power controllers in response to the determined switch current.

7. The system of claim 5, wherein the solid-state power controllers include a monitoring module that determines if the temperature of the solid-state power controllers exceeds a predetermined threshold and a control module that is configured to set the state of both of the solid-state power controllers in response to the determined temperature.

8. The system of claim 1, further comprising a communications component configured to apply an external voltage across a set of control terminals of the set of switching components to a state of the set of the switching components.

9. The system of claim 1, wherein the transient suppression component includes a set of transient voltage suppressors or a set of metal-oxide varistors.

10. The system of claim 9, wherein the transient suppression component further includes a flywheel diode coupled across the output of the set of switching components.

11. A method of distributing power, the method comprising:
applying power from a bipolar high voltage direct current source component with a positive voltage lead and a negative voltage lead to an electrical loading component capable of drawing power from the bipolar high voltage direct current source component through a set of switching components configured to selectively couple power from the bipolar high voltage DC source component to the electrical loading component by switching between an open state that decouples power from the bipolar high voltage direct current source component to the electrical loading component, and a closed state that couples power from the bipolar high voltage direct current source component to the electrical loading component, wherein a first subset of the switching components are coupled to the positive lead of the bipolar high voltage direct current source component and a second subset of the switching components are coupled to the negative lead of the bipolar high voltage direct current source component; and
limiting the current flowing through the set of switching components when the first subset and the second subset are not in the same state with a transient suppression component.

12. The method of claim 11, further including the steps of determining, by a monitoring module, if the switch current in the set of switching components exceeds a predetermined threshold, and setting, by a control module, the state of the set of switching components in response to the determined switch current.

13. The method of claim 11, further including the steps of determining, by a monitoring module, if the temperature in the set of switching components exceeds a predetermined threshold, and setting, by a control module, the state of the set of switching components in response to the determined temperature.

14. The method of claim 11, further including a step of staggering a current limit level of the first subset of the set of switching components from a current limit level of the second subset of the switching components such that when the electrical loading component experiences a short, the first subset of the switching components limits current before the second subset of the switching components.

15. A power switching device, comprising:
a set of switching components configured to selectively couple power from a bipolar high voltage direct current source component to an electrical loading component by switching between an open state that decouples power from the bipolar high voltage direct current source component to the electrical loading component and a closed state that couples power from the bipolar high voltage direct current source component to the electrical loading component wherein a first subset of the switching components are coupled to the positive lead of the bipolar high voltage direct current source component and a second subset of the switching components are coupled to the negative lead of the bipolar high voltage direct current source component; and a transient suppression component coupled to the set of switching components and configured to limit current flowing through the first or the second subset of the set of switching components when the first and the second subsets are not in the same state.

16. The power switching device of claim 15, wherein the set of switching components are configured to selectively couple power from the bipolar high voltage direct current source component that includes two 270 volt direct current power supplies.

17. The power switching device of claim 16, wherein a negative lead of one of the two 270 volt direct current power supplies is coupled to a chassis ground and the positive lead of the other of the two 270 volt direct current power supplies is coupled to the chassis ground.

18. The power switching device of claim 15, wherein the set of switching components includes two solid-state power controllers.

19. The power switching device of claim 15, wherein the transient suppression component includes a set of transient voltage suppressors or a set of metal-oxide varistors.

20. The power switching device of claim 19, wherein the transient suppression component further includes a flywheel diode coupled across the output of the set of switching components.

* * * * *